United States Patent
Takeoka et al.

(10) Patent No.: US 7,159,143 B2
(45) Date of Patent: Jan. 2, 2007

(54) METHOD FOR EVALUATING DELAY TEST QUALITY

(75) Inventors: Sadami Takeoka, Osaka (JP); Seiji Kajihara, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 453 days.

(21) Appl. No.: 10/766,951

(22) Filed: Jan. 30, 2004

(65) Prior Publication Data

US 2005/0028051 A1 Feb. 3, 2005

(30) Foreign Application Priority Data

Jan. 30, 2003 (JP) ............. P. 2003-021824
Jan. 27, 2004 (JP) ............. P. 2004-018291

(51) Int. Cl.
*G06F 11/00* (2006.01)
(52) U.S. Cl. ........................................ 714/30
(58) Field of Classification Search ............ 714/30, 714/32, 33, 37
See application file for complete search history.

(56) References Cited

U.S. PATENT DOCUMENTS

| 5,748,646 A | 5/1998 | Hosokawa |
| 6,708,139 B1 * | 3/2004 | Rearick et al. ............. 702/185 |
| 6,789,223 B1 * | 9/2004 | Fetherson ................... 714/738 |
| 2003/0149916 A1 * | 8/2003 | Ohtake et al. ................ 714/33 |
| 2003/0188246 A1 * | 10/2003 | Rearick et al. ............. 714/738 |

FOREIGN PATENT DOCUMENTS

JP 09-269959 10/1997

* cited by examiner

*Primary Examiner*—Nadeem Iqbal
(74) *Attorney, Agent, or Firm*—McDermott Will & Emery LLP

(57) ABSTRACT

All untestable delay faults are hardly calculated. Thus, when the fault coverage of an test sequence for a delay fault is calculated, the fault coverage is not calculated without excluding the number of untestable faults. Accordingly the fault coverage does not correctly represent a test quality.

The delay faults are partly selected to analyze how many untestable delay faults exist among the selected delay faults. Thus, the, number of untestable delay faults included all the delay faults are estimated. Thus, a method for evaluating a delay fault test quality for calculating the fault coverage that correctly represents the test quality by using this value is provided.

20 Claims, 11 Drawing Sheets

METHOD FOR EVALUATING DELAY TEST QUALITY

BACKGROUND OF THE INVENTION

1. Field of the Invention

The present invention relates to an evaluation for a quality indicating the failure test capability of an test sequence used when the delay fault testing of a semiconductor integrated circuit is carried out.

2. Description of the Related Art

With the recent rapid progress of the miniaturization technique of a semiconductor process, a semiconductor circuit has been rapidly progressively large-scaled and complicated. As a result, the test of the semiconductor integrated circuit has been more difficult. To meet this problem, a design for testability by a scan testing has been spread as means for facilitating the test of the semiconductor integrated circuit and a fault represented by a stuck-at fault model can be efficiently detected. When the fault that is assumed by the stuck-at fault model is detected, a capacity for detecting the fault does not depend on clock frequency. Accordingly, when a scan testing is performed, the test has been ordinarily carried out by the clock frequency that is lower than the speed of an actual operation. However, as the miniaturization of the semiconductor process progresses, variation in process appears. Therefore, the quality of an test cannot be adequately ensured only by the test under the low clock frequency using the usual scan testing. Thus, an test that takes a delay into consideration such as a delay fault detection technique using the same clock frequency as that upon actual operation has been required. The usual delay fault technique is disclosed in "JP-A-9-269959" or the like.

A fault coverage indicating the quality of an test sequence for a delay fault may be preferably ordinarily expressed by a following formula.

Fault coverage=number of detected faults/(total number of defined faults−number of untestable faults)×100%: (Formula 1)

However, since enormous calculating time and enormous memory of a computer are required to precisely calculate the number of untestable faults in the (Formula 1), such a calculation has been unrealistic. Therefore, the fault coverage has been hitherto ordinarily calculated by a below-described formula in place of the Formula 1.

Fault coverage=the number of detected faults/the total number of defined faults×100%: (Formula 2)

However, especially, in the case of a path delay fault, it has been known that the path delay fault is different from the stuck-at fault and the rate of untestable faults is extremely high. In a calculation method for the fault coverage that does not take the untestable faults into account as in the (Formula 2), the fault coverage may be possibly an extremely low value even if all the testable faults are detected. Consequently, a calculated value cannot inconveniently correctly evaluate the actual test quality.

Further, even if the (Formula 1) can be used, any of delay faults is regarded to be equal in view of importance. Therefore, the fault coverage of the (Formula 1) cannot adequately represent the test quality of the test sequence. This problem will be specifically described below by way of the drawing.

FIG. 11 is a diagram for showing the characteristics of delay faults defined on a semiconductor integrated circuit The lengths of arrow marks shown in the right side of signal paths 1 to 6 respectively show delay values of the respective signal paths in their design. A dotted line in the right side of the drawing shows the value of one clock rate of the semiconductor integrated circuit. For the convenience of explanation, all the signal paths 1 to 6 are described as testable paths.

Ordinarily, as the delay value of the signal path in its design increases (as the delay value comes nearer to the one clock rate), the signal path has a higher possibility of arising the delay fault. Accordingly, in FIG. 11, the signal path 3 apparently has a higher possibility of arising the delay fault than the signal path 6. Therefore, the quality of an test for detecting the delay fault defined in the signal path 3 may be said to be higher than that of an test for detecting the delay fault defined in the signal path 6. However, in the fault coverage which has been hitherto used, both when the delay fault on the signal path 3 is detected and when the delay fault on the signal path 6 is detected, one delay fault is considered to be equally detected and the quality is considered to be equal. For example, assuming that one delay fault is defined on each of the signal paths 1 to 6, both when the faults on the signal paths 1 to 3 are detected and when the faults on the signal paths 4 to 6 are detected, the fault coverage is ³⁄₆×100 [%]=50%, which is equal in both the cases.

When an test for detecting the faults on the signal paths 1 to 3 having large delay values is compared with an test for detecting the faults on the signal paths 4 to 6 having small delay values, the former obviously has a higher quality. Accordingly, the fault coverage (Formula 1) which has been used in the usual test does not precisely represents the quality of the test. Consequently, the quality of the test sequence used for the test has been undesirably erroneously evaluated.

SUMMARY OF THE INVENTION

For solving the above-described problems, it is a first object of the present invention to realistically put (the Formula 1) into practice by estimating the number of untestable delay faults when the quality of an test sequence for a delay fault is evaluated. Further, it is a second object of the present invention to provide a method for evaluating a delay fault test quality in which the quality of a delay fault test sequence can be more accurately evaluated by taking a delay value of a signal path in its design on which a delay fault is defined into consideration.

To achieve the above-described objects, a method for evaluating a quality of a delay fault test sequence comprises a delay fault definition unit for defining delay faults for a semiconductor integrated circuit; a delay fault selecting unit for selecting a part of the delay faults defined by the delay fault definition unit; a first testable/untestable deciding unit for deciding whether or not a test can be performed for each delay fault selected by the delay fault selecting unit; and a delay fault coverage calculating unit for calculating a delay fault coverage by using the number of the delay faults decided to be testable by the testable/untestable deciding unit among the selected faults.

Further, according to the present invention, in the method for evaluating a delay fault test quality, the delay fault defining unit defines path delay faults for all signal paths in the semiconductor integrated circuit.

Further, according to the present invention, in the method for evaluating a delay fault test quality, the delay fault defining unit defines the delay faults for all nodes in the semiconductor integrated circuit.

Here, the node indicates each terminal of a signal line or a gate.

Further, according to the present invention, in the method for evaluating a delay fault test quality, a second testable/untestable deciding unit is provided for previously deciding whether or not the delay faults to be processed in the semiconductor integrated circuit can be tested.

Further, the delay fault defining unit includes a second testable/untestable deciding unit for previously deciding whether or not the delay faults in the semiconductor integrated circuit can be respectively tested to define only the delay faults decided to be testable by the second testable/untestable deciding unit in the semiconductor integrated circuit.

Otherwise, the delay fault defining unit defines a prescribed number of delay faults smaller than the total number of delay faults for the semiconductor integrated circuit.

Further, the delay fault selecting unit selects a prescribed number or a prescribed rate of delay faults of the delay faults defined by the delay fault defining unit at random.

Otherwise, the delay fault selecting unit selects the signal path having a maximum delay value that passes the node for each node among the path delay faults defined by the delay fault defining unit.

Otherwise, the delay fault selecting unit selects the signal path having a maximum number of steps of gates that passes the node for each node among the path delay faults defined by the delay fault defining unit.

Otherwise, the delay fault selecting unit selects the longest signal path that passes the node for each node among the path delay faults defined by the delay fault defining unit.

Further, the first testable/untestable deciding unit forms an test sequence for the delay fault selected by the delay fault selecting unit and decides the delay fault in which the test sequence cannot be formed to be untestable.

Further, the delay fault coverage calculating unit further includes a delay fault simulation unit for performing a delay fault simulation by using the provided test sequence for the delay faults defined by the delay fault defining unit; and a fault coverage calculating unit for calculating a fault coverage by using the number of delay faults defined by the delay fault defining unit, the number of delay faults which are decided to be untestable by the first testable/untestable deciding unit and the number of delay faults detected by the delay fault simulation.

Otherwise, the fault coverage calculating unit takes a value obtained by integrating a ratio of the number of delay faults selected by the delay fault selecting unit to the number of delay faults defined by the delay fault defining unit relative to the number of delay faults decided to be untestable by the first testable/untestable deciding unit as a total number of untestable faults, takes a numerator of the delay fault coverage as the number of delay faults detected by the delay fault simulation unit and calculates a denominator of the delay fault coverage by subtracting the total number of delay faults incapable of being tested from the number of untestable delay faults selected by the delay fault selecting unit.

Furthermore, the delay fault defining unit further includes a first total value calculating unit for calculating the total value of a quantity of delay of the signal paths in design on which the path delay faults are defined, the first testable/untestable deciding unit further includes a second total value calculating unit for calculating the total value of a quantity of delay of the signal paths in design on which the path delay faults are decided to be untestable, and the delay fault coverage calculating unit further includes a third total value calculating unit for calculating the total value of a quantity of delay of the signal paths in design on which the path delay faults are detected and a fault coverage calculating unit for calculating a fault coverage by using the total value of the quantity of delay of the signal paths in design on which the defined path delay faults are calculated by the first total value calculating unit, the total value of the quantity of delay of the signal paths in design on which the untestable path delay faults incapable of being tested are calculated by the second total value calculating unit and the total value of the quantity of delay of the signal paths in design on which the detected path delay faults are calculated by the third total value calculating unit.

Further, the coverage calculating unit takes a value obtained by integrating a ratio of the number of delay faults selected by the delay fault selecting unit to the number of delay faults defined by the delay fault defining unit relative to the total value of the quantity of delay of the signal paths in design on which the untestable path delay faults are calculated by the second total value calculating unit as a total quantity of untestable faults, takes a numerator of the delay fault coverage as the total value of the quantity of delay of the signal paths in design on which the detected path delay faults are calculated by the third total value calculating unit, and calculates a denominator of the delay fault coverage by subtracting the total quantity of untestable faults from the total value of the quantity of delay of the signal paths in design on which the defined path delay faults are calculated by the first total value calculating unit.

Further, as the quantity of delay of the signal path in design, a delay value of the signal path in design, the number of the steps of the gates on the signal path or a physical length of the signal path is used.

DETAILED DESCRIPTION OF THE PREFERRED EMBODIMENTS

Ordinarily, a delay fault on one node or a signal path has two kinds of faults of a rise edge transition and a fall edge transition. The delay faults are represented by the combinations of kinds of nodes or signal paths with the transitions. However, in this specification, for the convenience of explanation, the kinds of the transitions will be omitted and an explanation will be given by defining one delay fault on one node or one signal path.

(First Embodiment)

This embodiment explains a specific method for improving an accuracy of evaluating the quality of a delay fault test sequence by estimating the number of untestable delay faults among the defined delay faults.

Figure 1:
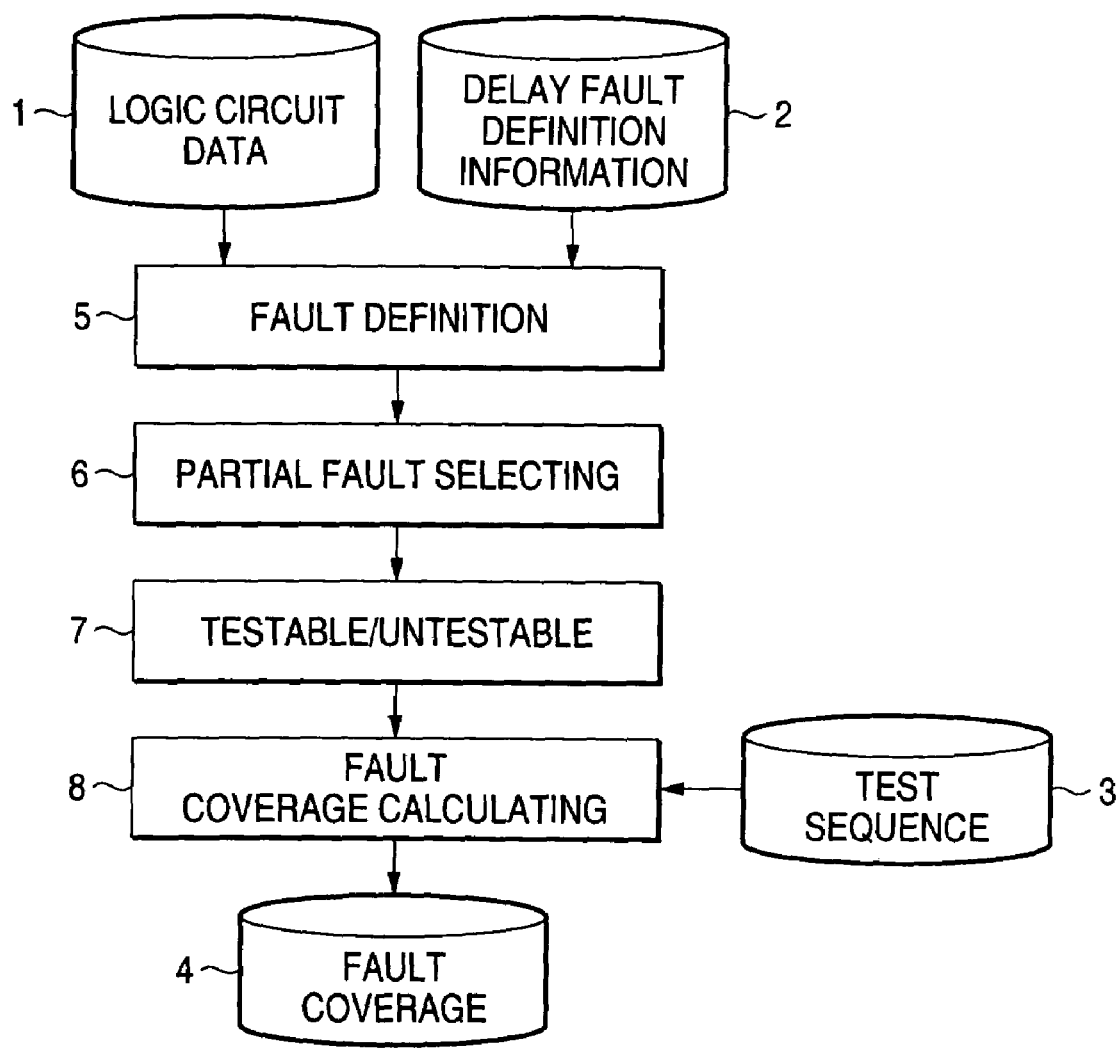
FIG. 1 is a flow chart showing a method for evaluating a delay fault test quality according to an embodiment of the present invention.

FIG. 1 is a flow chart showing a method for evaluating a delay fault test quality according to the present invention. Reference numeral 1 designates logic circuit data. 2 designates delay fault definition information for defining a delay fault in a logic circuit. 3 designates an test sequence used for a delay fault test. 4 designates a fault coverage. 5 designates a fault defining operation for defining the delay fault for the logic circuit. 6 designates a partial fault selecting operation for selecting a part of the defined faults. 7 designates a testable/untestable operation for deciding whether or not the selected fault can be tested. 8 designates a fault coverage calculating operation for calculating the fault coverage. In the delay fault defining information 2, information necessary for defining the faults in the logic circuit such as the list of faults to be defined, an instruction for defining all faults, or an instruction for defining the faults only for a part of blocks of the logic circuit is to be stored.

Figure 2:
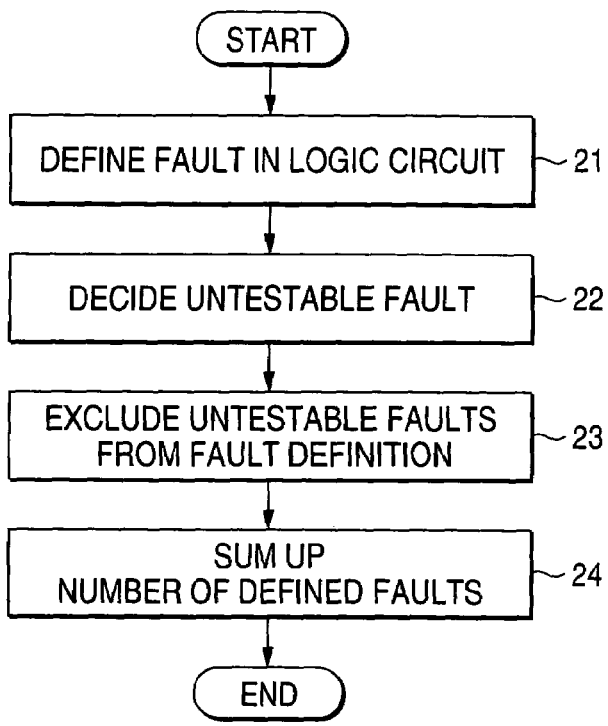
FIG. 2 is a flow chart for more specifically explaining a part of the flow chart shown in FIG. 1.

FIG. 2 is a flow chart for more specifically showing the fault defining operation 5. Reference numeral 21 designates an operation for defining a fault for the logic circuit. 22 designates an operation for deciding a fault to be untestable that discriminates the fault which can be easily discriminated to be untestable as a pre-process, for the defined fault. 23 designates an operation for excluding the fault decided to be untestable in the operation 22 from a fault definition. 24 designates an operation for summing up the number of faults which are not excluded and defined as a result of the operation 23.

Figure 3:
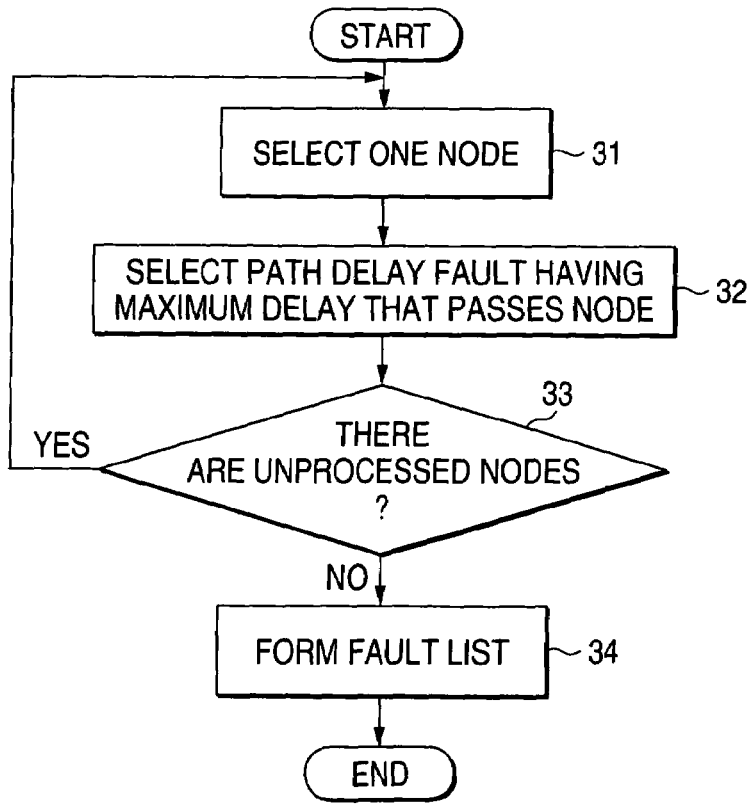
FIG. 3 is a flow chart for more specifically explaining a part of the flow chart shown in FIG. 1.

FIG. 3 is a flow chart for more specifically showing the partial fault selecting operation 6. Reference numeral 31 designates an operation for selecting one node in the circuit. 32 is an operation for selecting a path delay fault having a maximum delay value that passes the selected node. 33 designates a decision for deciding whether or not a non-processed node exists. 34 designates an operation for summing up a signal path selected in the operation 32. In the operation 32, when there are a plurality of signal paths having the maximum value, all the signal paths are selected.

FIG. 4A is a flow chart for more specifically showing the testable/untestable operation in the operation 7. Reference numeral 41 designates an operation for selecting one delay fault. 42 designates an operation for generating an test sequence for the selected delay fault. 43 is a decision for deciding whether or not a non-processed fault exists. 44 designates an operation for summing up the number of faults decided to be untestable in the operation 42. A method for forming the test sequence in the operation 42 employs an usually utilized ordinary method in this embodiment. Thus, the detailed explanation thereof is omitted.

Figure 5:
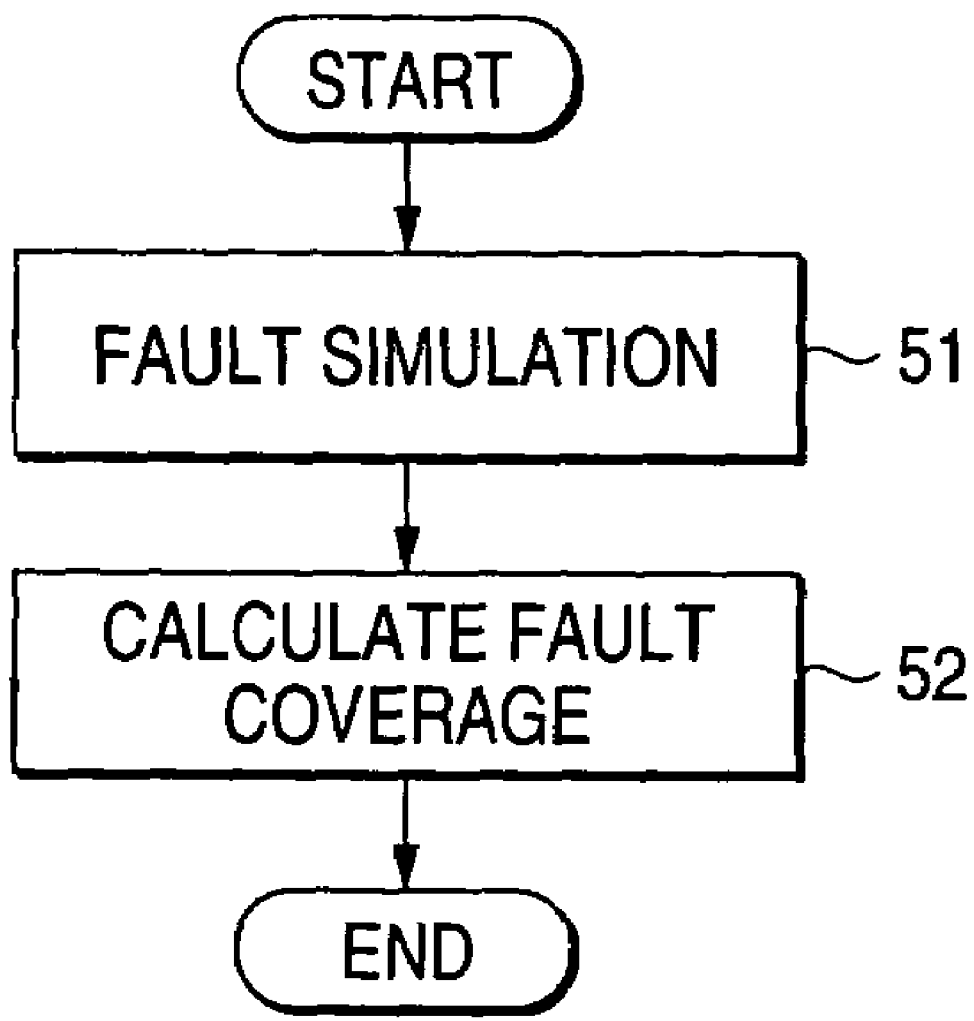
FIG. 5 is a flow chart for more specifically explaining a part of the flow chart shown in FIG. 1.

FIG. 5 is a flow chart for more specifically showing the fault coverage calculating operation in the operation 8. Reference numeral 51 designates an operation for performing a fault simulation. Reference numeral 52 designates a fault coverage calculating operation for calculating the fault coverage.

Figure 12:
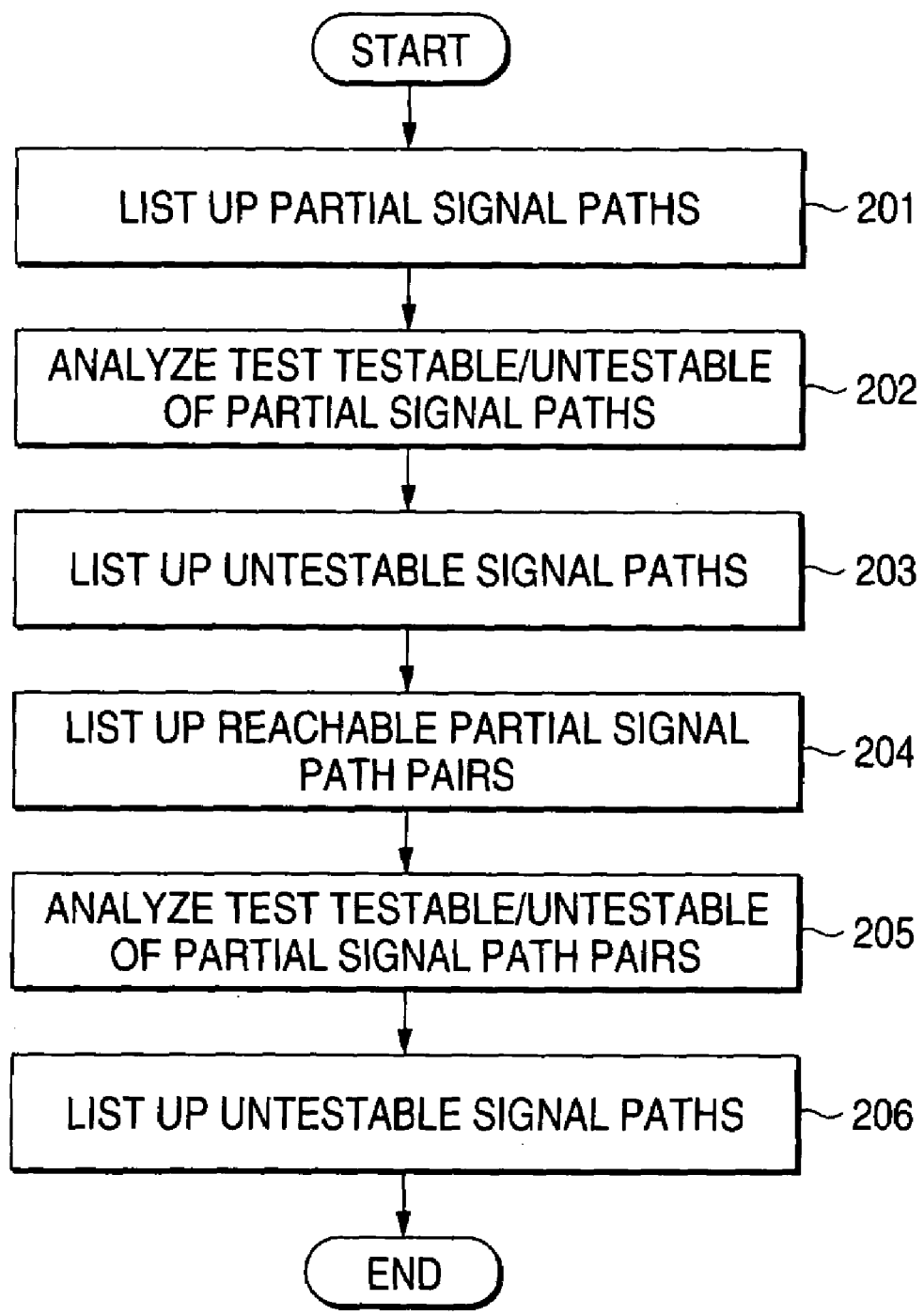
FIG. 12 is a flow chart for more specifically explaining a part of the flow chart shown in FIG. 2.

FIG. 12 is a flow chart for more specifically showing the operation 22. In this embodiment, the operation 22 is explained as using an ordinarily employed known method (for instance, see "Electronic Information Communication Learned Society Thesis Journal D-I Vol. J82-D-1 No. 7, pp. 888–896). Reference numeral 201 designates an operation for listing up partial signal paths. 202 designates an operation for analyzing whether or not a fault can be tested for each of the partial signal path. 203 designates an operation for listing up all path delay faults passing the partial signal paths which cannot be tested as untestable faults. 204 designates an operation for listing up reachable partial signal path pairs. 205 designates an operation for analyzing whether or not the partial signal path pairs can be tested. 206 designates an operation for listing up the path delay faults passing the partial signal path pairs which are decided to be untestable in the operation 204.

Figure 13:
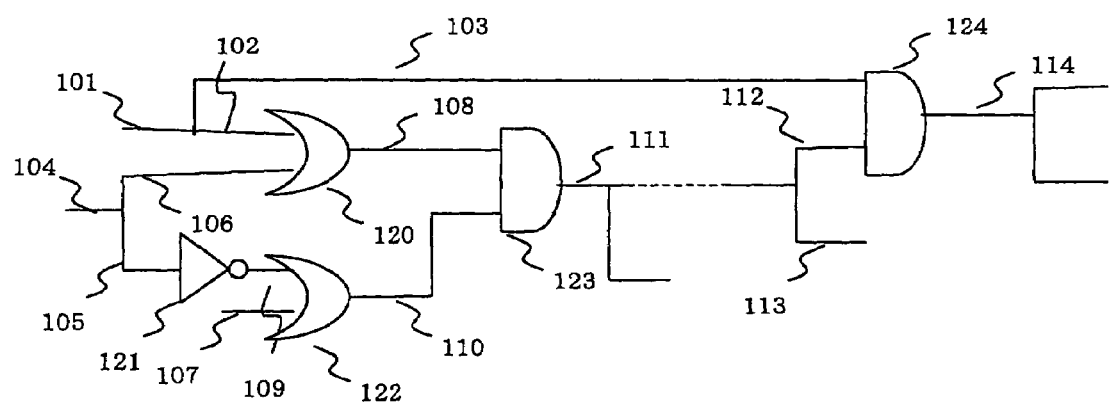
FIG. 13 is a diagram for supplementing the embodiment shown in FIG. 12.

FIG. 13 is a circuit diagram for explaining this embodiment. Reference numerals 101 to 114 designate signal lines. 120 designates an OR gate. 121 to 122 designate inverters. 123 to 124 designate AND gates.

Now, the first embodiment of the present invention will be described below in more detail by referring to FIGS. 1 to 5 and FIGS. 12 to 13.

In this embodiment, as one example of the delay fault, the path delay fault will be employed and described.

Firstly, the fault defining operation 5 is performed for the logic circuit data 1 by using the delay fault defining information 2. In the delay fault defining information 2 described in this embodiment, the instruction for defining all the faults is stored. Then, in the fault defining operation 5, the path delay faults are firstly defined for all the signal paths in the logic circuit on the basis of the instruction of the delay fault defining information 2 in the operation 21. Here, it is assumed that the number of the defined path delay faults and the number of the untestable faults which are included therein are respectively 15000 and 2200.

Then, in the operation 22, a simple test for deciding a path to be untestable is carried out for all the defined path delay faults. Firstly, in the operation 201, the partial signal paths are listed up. Here, the partial signal path means a signal path having an external input (including an external bi-direct) or a branch of a fan-out as a start point and an external output (including an external bi-direct) or a stem of the branch as an end point. In FIG. 13, for instance, signal lines 102, 103, 105 and 106 are the branches of the fan-outs. Signal lines 101, 104, 111 and 114 are the stems of the branches. Thus, in the operation 201, five paths including a path (a signal line 103 to a signal line 114), a path (a signal line 102 to a signal line 108 to a signal line 111), a path (a signal line 106 to a signal line 108 to a signal line 111), a path (a signal line 105 to a signal line 109 to a signal line 110 to a signal line 111) and a path (a signal line 112 to a signal line 114) are listed up as the partial signal paths. Subsequently, in the operation 202, an analysis is performed about whether or not the five partial signal paths can be tested. Here, for each of the partial signal paths, a test sequence for an operation for the propagation of a transition is generated. When the result of the test generation is successful, the partial signal path is decided to be testable. When an inconsistency occurs, the partial signal path is decided to be untestable. For instance, in the path (the signal path 106 to the signal path 108 to the signal path 111), if the values of signal lines 101 and 107 can be fixed to 0 and 1, the path can be sensitized. Thus, the partial signal path can be decided to be testable. Now, in the operation 202, it is assumed that since the signal line 107 is always fixed to 1, only the path (the signal line 105 to the signal line 109 to the signal line 110 to the signal line 111) is decided to be untestable and all other partial signal paths are decided to be testable. Then, in the operation 203, all the path delay faults that pass the path (the signal line 105 to the signal line 109 to the signal line 110 to the signal line 111) as the untestable partial signal path are listed up as the untestable faults. Here, it is assumed that 2000 faults are listed up. Subsequently, in the operation 204, all the reachable partial signal partial signal path pairs are listed up except the untestable partial signal path. For instance, the path (the signal line 102 to the signal line 108 to the signal line 111) can reach the path (the signal line 112 to the signal line 114). When a pair of the two partial signal paths is expressed as {the path (the signal line 102 to the signal line 108 to the signal line 111), the path (the signal line 112 to the signal line 114)}, two pairs of the partial signal paths {the path (the signal line 102 to the signal line 108 to the signal line 111), the path (the signal line 112 to the signal line 114)} and {the path (the signal line 106 to the signal line 108 to the signal line 111), the path (the signal line 112 to the signal line 114)} are listed up. Further, in the operation 205, whether or not each pair of the partial signal paths can be tested is decided. For instance, in {the path (the signal line 106 to the signal line 108 to the signal line 111), the path (the signal line 112 to the signal line 114)}, the value of the signal line 102 needs to be 0 in order to propagate a transition of the path (the signal line 106 to the signal line 108 to the signal line 111). However, on the other hand, in order to propagate a transition of the path (the signal line 106 to the signal line 108 to the signal line 111), the value of the signal line 103 needs to be 1. Both the results are incompatible. Accordingly, {the path (the signal line 106 to the signal line 108 to the signal line 111), the path (the signal line 112 to the signal line 114)} is decided to be untestable. On the other hand, it is assumed that the path {(the signal line 102 to the signal line 108 to the signal line 111), the path (the signal line 112 to the signal line 114)} has no incompatibility and is decided to be testable. Finally, in the operation 206, all the path delay faults that pass {the path (the signal line 106 to the signal line 108 to the signal line 111), the path (the signal line 112 to the signal line 114)} are listed up as the untestable faults. Here, it is assumed that 3000 faults are listed up.

Accordingly, in the operation 22, a total of 5000 path delay faults is decided to be untestable. Subsequently, in the operation 23, the 5000 path delay faults decided to be untestable are excluded from a definition. Further, in the operation 24, the number of the defined faults is summed to 10000 in accordance with (15000−5000).

Then, in the partial fault selecting operation 6, one node is firstly selected in the operation 31. It is assumed that 3000 nodes exist in the provided logic circuit data 1. Then, in the operation 32, the path delay fault having the largest delay value on the signal path is selected among the defined path delay faults that pass the selected node. If there is no defined path delay fault that passes the selected node, the node is taken as a node in which a process is finished to advance to the operation 33. Now, it is assumed that ten nodes are included on the selected path delay fault. Subsequently, in the operation 33, it is decided whether or not nodes that are not processed are present. Since 2990 nodes are not pro- cessed, the procedure advances again to the operation 31 to select one node that is not processed, advance to the operation 32 and select a path delay fault having the largest delay value on the signal path that passes the selected node. It is assumed that twenty nodes are included on the presently selected path delay fault. Subsequently, in the operation 33, it is decided whether or not there are nodes that are not processed. Since 2970 nodes are not processed, the procedure advances again to the operation 31. Then, the operations from the operation 31 to the operation 33 are likewise repeated In the decision 33, when there is not any node that is not processed, the path delay faults that have been yet selected in the operation 32 are finally summed to form a fault list in the operation 34. Now, it is assumed that the fault list composed of 1000 path delay faults is formed.

Then, in testable/untestable deciding operation 7, one path delay fault in the fault list formed in the operation 34 is firstly selected in the operation 41. Then, in the operation 42, an test sequence for the selected fault is generated to decide whether or not the fault can be tested. Subsequently, in the operation 43, whether or not there are faults that are not processed is decided. Here, since 998 faults still remain, the procedure advances again to the operation 41 to newly select one path delay fault. Then, in the operation 42, an test sequence for the selected fault is formed to decide whether or not the fault can be tested. Subsequently, in the operation 43, whether or not there are faults that are not processed is decided. Since 998 faults still remain, the procedure advances again to the operation 41. The operations from the operation 41 to the operation 43 are similarly repeated. When there is not any fault that is not processed in the operation 43, the number of faults decided to be untestable in the operation 42 is finally summed in the operation 44. Now, it is assumed that the number of faults decided to be untestable in the operation 42 is 200.

Then, in the fault coverage calculating operation 8, a fault simulation is firstly performed by using the provided test sequence 3 in the operation 51. At this time, the faults, which are objects for the fault simulation, are all the faults summed in the operation 24. It is assumed that the number of faults detected in this operation is 6000. Then, in the operation 52, it is assumed that the number of faults detected in the operation 51 is taken as the number of detected faults, the number of the defined faults summed in the operation 24 is taken as all the number of defined faults, the number of faults in the fault list formed in the operation 34 is taken as the number of partial selected faults and the number of untestable faults that is summed in the operation 44 is taken as the number of partial untestable faults. Thus, the estimated number of untestable faults in all the number of the defined faults is calculated in accordance with a Formula described below.

The estimated number of untestable faults=the number of partial untestable faults×all the number of defined faults/the number of partial selected faults     (Formula 3)

Then, the fault coverage is calculated in accordance with a following Formula by using the calculated estimated number of untestable faults.

The fault coverage=the number of detected faults/(all the number of defined faults−the estimated number of untestable faults)×100%     (Formula 4)

Since the number of the partial untestable faults, all the number of the defined faults, the number of the partial selected faults and the number of the detected faults are presently respectively 200, 10000, 1000 and 6000, the estimated number of the untestable faults is calculated to be 2000 in accordance with the (Formula 3). Then, the fault coverage is calculated to be 75% in accordance with the (Formula 4).

On the other hand, since the actual number of untestable faults is 2200 (an unrealistic time is necessary), when an actual fault coverage is calculated, the fault coverage is 76.9% in accordance with the (Formula 1).

As compared therewith, in the fault coverage in accordance with the (Formula 2) which has been hitherto used in place of the Formula 1, since the number of untestable faults is not absolutely taken into account, a very low value as small as 60% is obtained. As a result, the test quality by the provided test sequence is undesirably estimated to be excessively low.

As an example of an actual experimental result, when an test sequence in which a fault coverage (the Formula 2) which has been hitherto substituted is 80% from a practice result for s38417 as one of bench mark circuits of ISCAS 89 is used to obtain the actual coverage of untestable faults (the Formula 1) and the fault coverage (the Formula 4) according to the method of the present embodiment, the fault coverage are respectively 85.6% and 85.7%. Thus, as apparently understood therefrom, the method of the present embodiment has an extremely high accuracy.

As described above, in the method for evaluating the delay fault test quality according to the present invention, the number of faults estimated to be untestable is taken into account. Thus, the value of the fault coverage near to the actual fault coverage can be calculated.

Since the number of faults selected in the operation 6 is 1000 relative to the number of faults (10000) defined in the operation 5, the rate of the former to the latter is 0.1. At this time, when an error of the fault coverage calculated in the operation 8 is statistically obtained as, for instance, 0.5%, a value of (75%−0.5%)=74.5% is used as the fault coverage. The excessive estimation of the fault coverage considering a sampling error can be more effectively prevented. As a simpler method, the value of a prescribed error (for instance. 1%) is employed irrespectively of the rate of the number of the faults selected in the operation 6 relative to the number of the defined faults in the operation 5, so that the quantity of calculation can be suppressed.

As a method for performing the partial fault selecting operation 6, a prescribed number of faults may be selected at random from the faults defined in the operation 24 in place of the method shown in FIG. 3 used for explaining the present embodiment to apparently obtain the same effect.

Further, according to this embodiment, in the operation 32, the path delay fault having the maximum delay value that passes the node is selected. However, the maximum number of steps of gates or the maximum physical length of the signal path may be used in place of the maximum delay value to obtain the same effect. As the physical length of the signal path, the sum total of wiring length on the signal path that can be calculated from layout data may be used.

Further, according to this embodiment, the contents of the delay fault defining information 2 include the instruction for defining all the faults. However, an instruction for defining not all the faults but a part of the faults such as an instruction for defining the faults for the fault list composed of a part of all the faults or one block of the logic circuit data 1 may obtain the same effect.

In the first embodiment, the second testable/untestable deciding unit is provided for previously deciding whether or not the delay faults of the semiconductor integrated circuit can be tested. Then, only the delay faults decided to be testable by the second testable/untestable unit are defined in the semiconductor integrated circuit. However, as illustrated in a modified example shown in FIG. 4B, an operation 40 for deciding whether or not a fault is untestable may be added to a pre-stage of an operation 41 (corresponds to the process of the first testable/untestable) in place of the operations from the operation 22 to the operation 24 shown in FIG. 2. In this case, the operation 40 for summing up the number of the untestable faults may be replaced by an operation 44S for adding the delay faults decided to be untestable in the operation 40 to the sum of the untestable faults.

Thus, objects to be processed in the operation (operation 40) for deciding faults to be untestable are only the selected faults. Accordingly, the quantity of calculation for deciding the faults to be untestable can be reduced and further processes can be performed at high speed.

(Second Embodiment)

A second embodiment describes a method different from the first embodiment that improves an accuracy of evaluating the quality of a delay fault test pattern by estimating the number of the untestable delay faults among the defined delay faults.

In the second embodiment, as another example of a delay fault, a delay fault on a node is used and explained. In the second embodiment, the delay fault on the node is called a transition fault.

Figure 6:
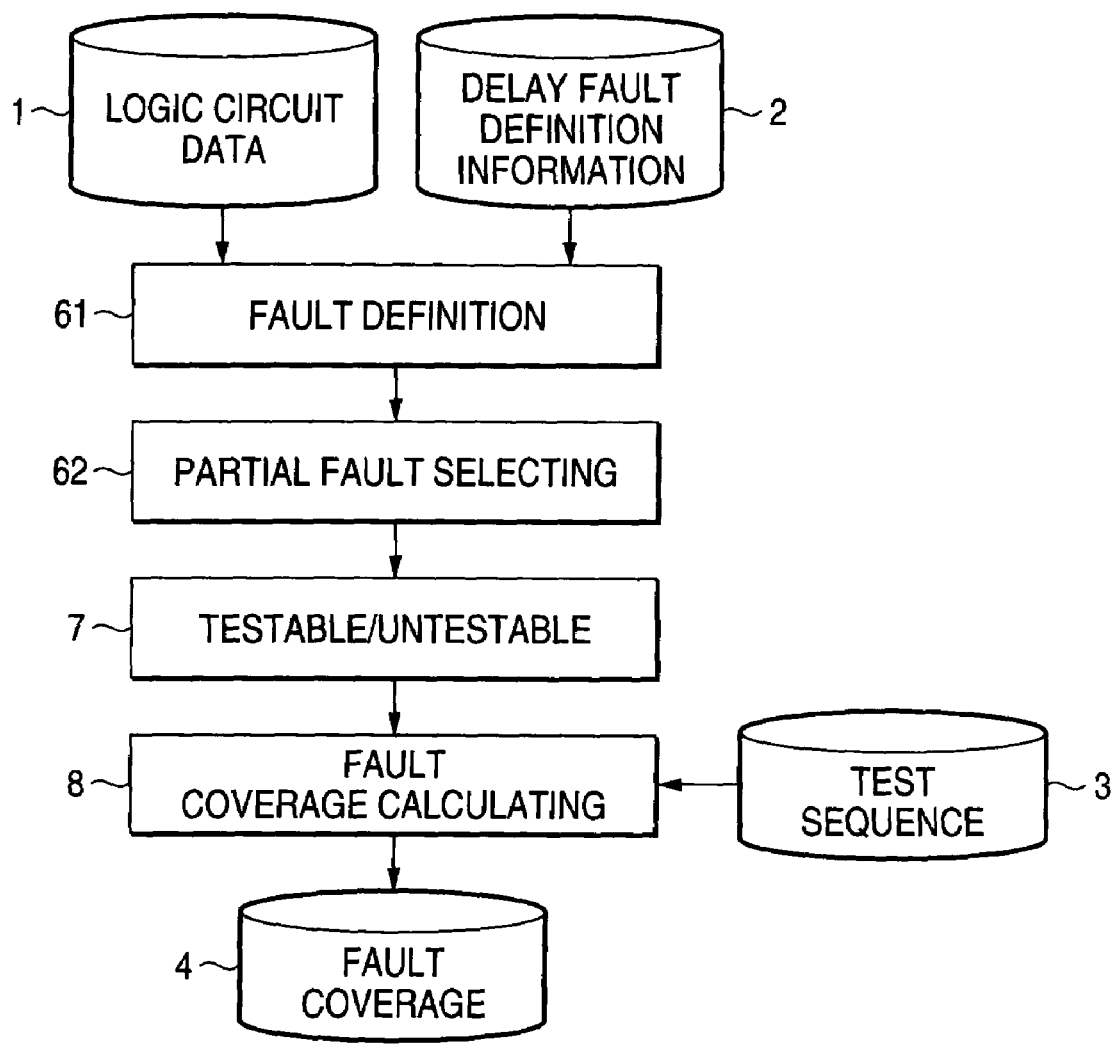
FIG. 6 is a flow chart showing a method for evaluating a delay fault test quality according to an embodiment of the present invention.

FIG. 6 is a flow chart showing a method for evaluating a delay fault test quality according to the present invention. Reference numeral 61 designates a fault defining operation for defining a fault to each node in a logic circuit. 62 designates an operation for selecting a prescribed number or a prescribed rate of faults of the defined faults. Other reference numerals correspond to the reference numerals shown in FIG. 1.

Figure 4:
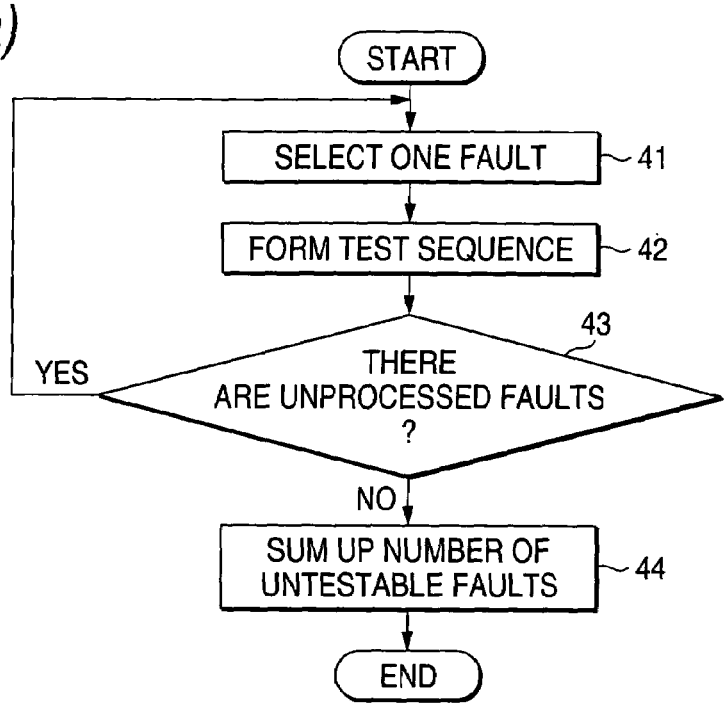
FIG. 4 is a flow chart for more specifically explaining a part of the flow chart shown in FIG. 1.
Figure 4:
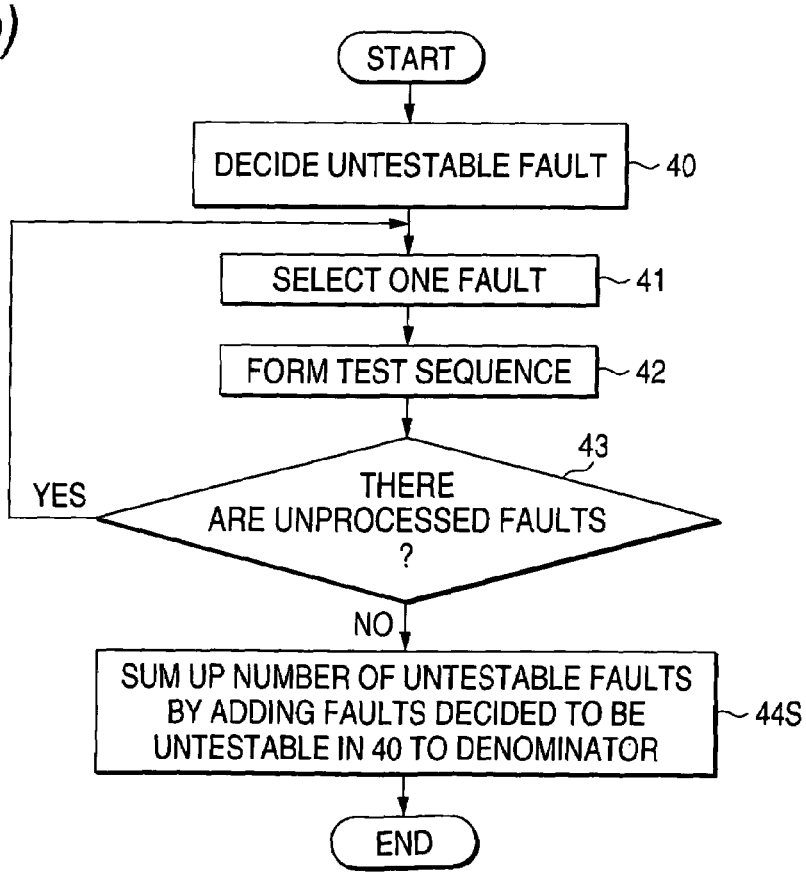

Now, the second embodiment of the present invention will be described by referring to FIGS. 6, 4 and 5.

Firstly, the fault defining operation 61 is performed by using delay fault defining information 2 for provided logic circuit data 1. In this embodiment, in the delay fault defining information 2, an instruction for defining all faults is stored. Then, in the fault defining operation 61, the transition faults are defined for all the nodes of the provided logic circuit data 1. Now, assuming that there are 3000 nodes in the provided logic circuit data 1, all the number of defined faults is 3000. At this time, it is assumed that the number of untestable faults included in the 3000 faults is 520.

Then, in a partial fault selecting operation 62, the prescribed number or the prescribed rate of faults of all the number of defined faults is selected at random. Here, assuming that the prescribed rate of 10% of the faults is selected, the number of faults selected at random in the operation 62 is 300.

Then, in a testable/untestable operation 7, one fault is firstly selected among the 300 transition faults selected in the operation 62 in an operation 41. Then, in an operation 42, an test sequence for the selected fault is formed to decide whether or not the fault can be tested. Subsequently, in an operation 43, whether or not there are faults unprocessed is decided. Here, since 299 faults still remain, the procedure advances again to the operation 41 to newly select one transition fault. Then, in the operation 42, an test sequence for the selected fault is generated to decide whether or not the fault can be tested. Subsequently, in the operation 43, whether or not there are unprocessed faults is decided. Since 298 faults still remain, the procedure advances again to the operation 41. The operations from the operation 41 to the operation 43 are similarly repeated. When there is not any unprocessed fault in the operation 43, the number of faults decided to be untestable in the operation 42 is finally summed in an operation 44. Now, it is assumed that the number of faults decided to be untestable in the operation 42 is 50.

Then, in a fault coverage calculating operation 8, a fault simulation is firstly performed by using the provided test sequence 3 in an operation 51. At this time, the faults, which are targets for the fault simulation, are all the faults defined in the operation 61. It is assumed that the number of faults detected in this operation is 2000. Then, in an operation 52, it is assumed that the number of faults detected in the operation 51 is taken as the number of detected faults, the number of the faults defined in the operation 61 is taken as all the number of defined faults, the number of faults selected in the operation 62 is taken as the number of partial selected faults and the number of untestable faults that are summed in the operation 44 is taken as the number of partial untestable faults. Thus, the estimated number of untestable faults in all the number of the defined faults is calculated in accordance with the (Formula 3). Then, the fault coverage is calculated in accordance with the (Formula 4) by using the calculated estimated number of untestable faults.

Since the number of the untestable partial faults, all the number of the defined faults, the number of the partial selected faults and the number of the detected faults are presently respectively 50, 3000, 300 and 2000, the estimated number of the untestable faults is calculated to be 500 in accordance with the (Formula 3). Then, the fault coverage is calculated to be 80% in accordance with the (Formula 4).

On the other hand, since the actual number of untestable faults is 520, when an actual fault coverage is calculated, the fault coverage is 80.6% in accordance with the (Formula 1).

As compared therewith, in the fault coverage in accordance with the (Formula 2) which has been hitherto used in place of the Formula 1, since the number of untestable faults is not absolutely taken into account, a very low value as small as 66.7% is obtained. As a result, the test quality by the provided test sequence is undesirably estimated to be excessively low.

Since the number of faults selected in the operation 62 is 300 relative to the number of faults (3000) defined in the operation 61, the rate of the former to the latter is 0.1. At this time, when an error of the fault coverage calculated in the operation 8 is statistically obtained as, for instance, 0.5%, a value of (80%−0.5%)=79.5% is used as the fault coverage. The excessive estimation of the fault coverage considering a sampling error can be more effectively prevented. As a simpler method, the value of a prescribed error (for instance. 1%) is employed irrespectively of the rate of the number of the faults selected in the operation 62 relative to the number of the defined faults in the operation 61, so that the quantity of calculation can be suppressed.

Further, according to this embodiment, the contents of the delay fault defining information 2 include the instruction for defining all the faults. However, an instruction for defining not all the faults but a part of the faults such as an instruction for defining the faults for the fault list composed of a part of all the faults or for one block of the logic circuit data 1 may obtain the same effect.

(Third Embodiment)

A third embodiment describes a specific method for improving an accuracy of evaluating the quality of a delay fault test sequence by evaluating the quality of the delay fault test sequence by using a delay value on a signal path in its design for defining a delay fault.

In this embodiment, as one example of the delay fault, a path delay fault is used and explained.

Figure 7:
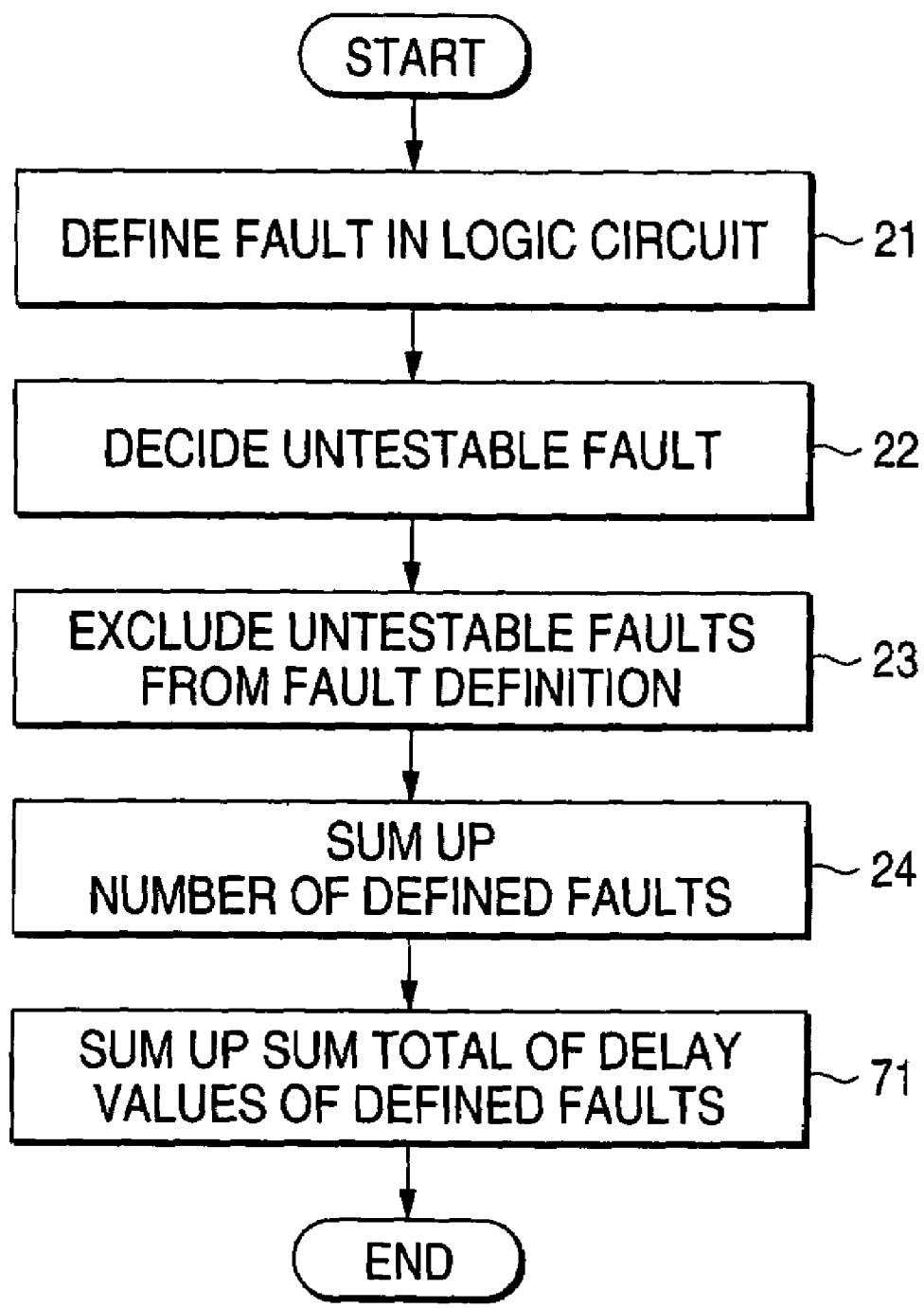
FIG. 7 is a flow chart for more specifically explaining a part of the flow chart shown in FIG. 1.

FIG. 7 is a flow chart for more specifically showing the fault defining operation of the operation 5. Reference numeral 71 designates an operation for calculating the sum total of delay values on signal paths in their design for all path delays defined on a logic circuit by an operation 24. Other reference numerals than 71 designate the same operations as those of the corresponding reference numerals in FIG. 2.

Figure 8:
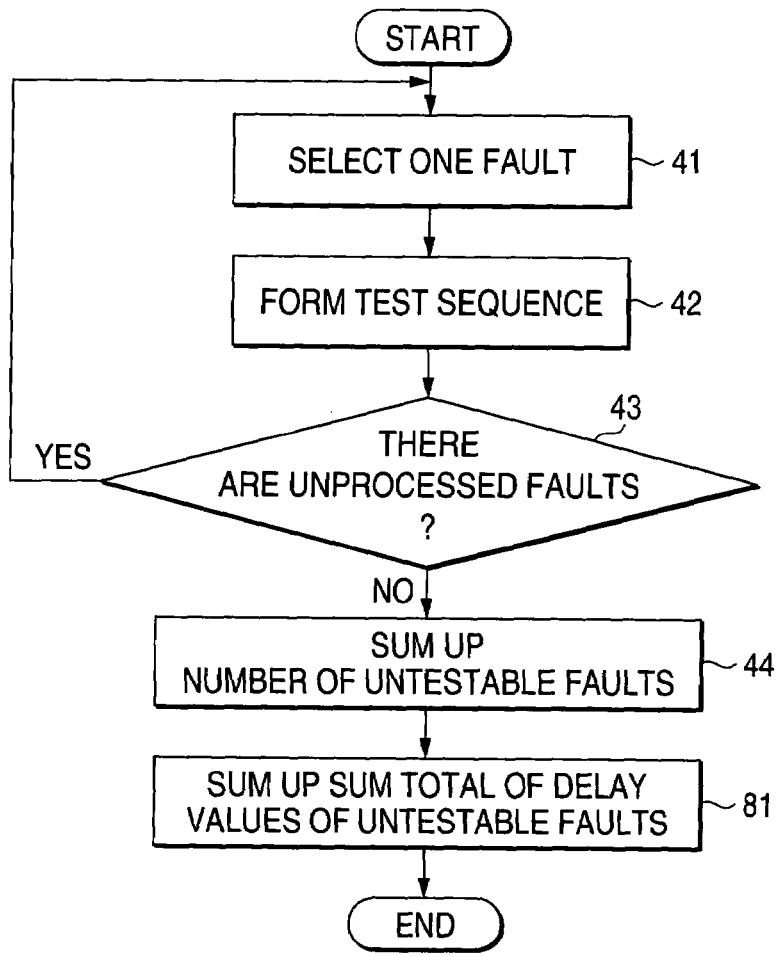
FIG. 8 is a flow chart for more specifically explaining a part of the flow chart shown in FIG. 1.

FIG. 8 is a flow chart for more specifically showing the testable/untestable deciding operation of the operation 7. Reference numeral 81 designates an operation for calculating the sum total of the delay values on the signal paths in their design for all untestable faults that are summed in an operation 44. Other reference numerals than the reference numeral 81 designate the same operations as those of the corresponding reference numerals in FIG. 4.

Figure 9:
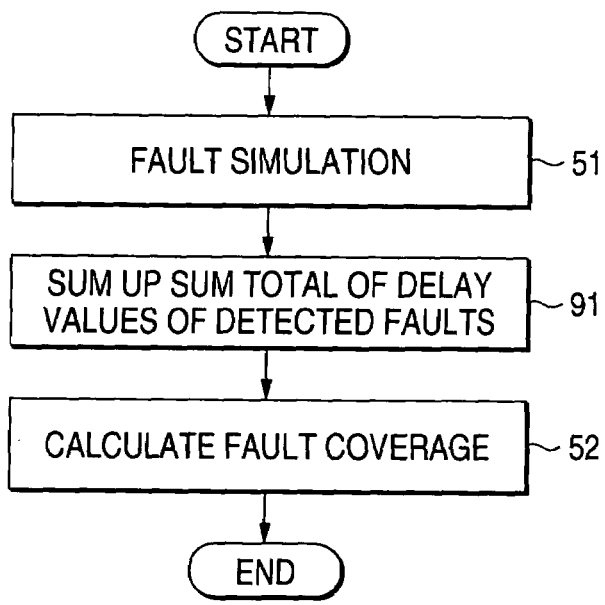
FIG. 9 is a flow chart for more specifically explaining a part of the flow chart shown in FIG. 1.

FIG. 9 is a flow chart for more specifically showing the fault coverage calculating operation of the operation 8. Reference numeral 91 designates an operation for calculating the sum total of the delay values on the signal paths in their design for all path delay faults detected by a fault simulation of an operation 51. Other reference numerals than the reference numeral 91 designate the same operations as those of the corresponding reference numerals in FIG. 5.

Figure 10:
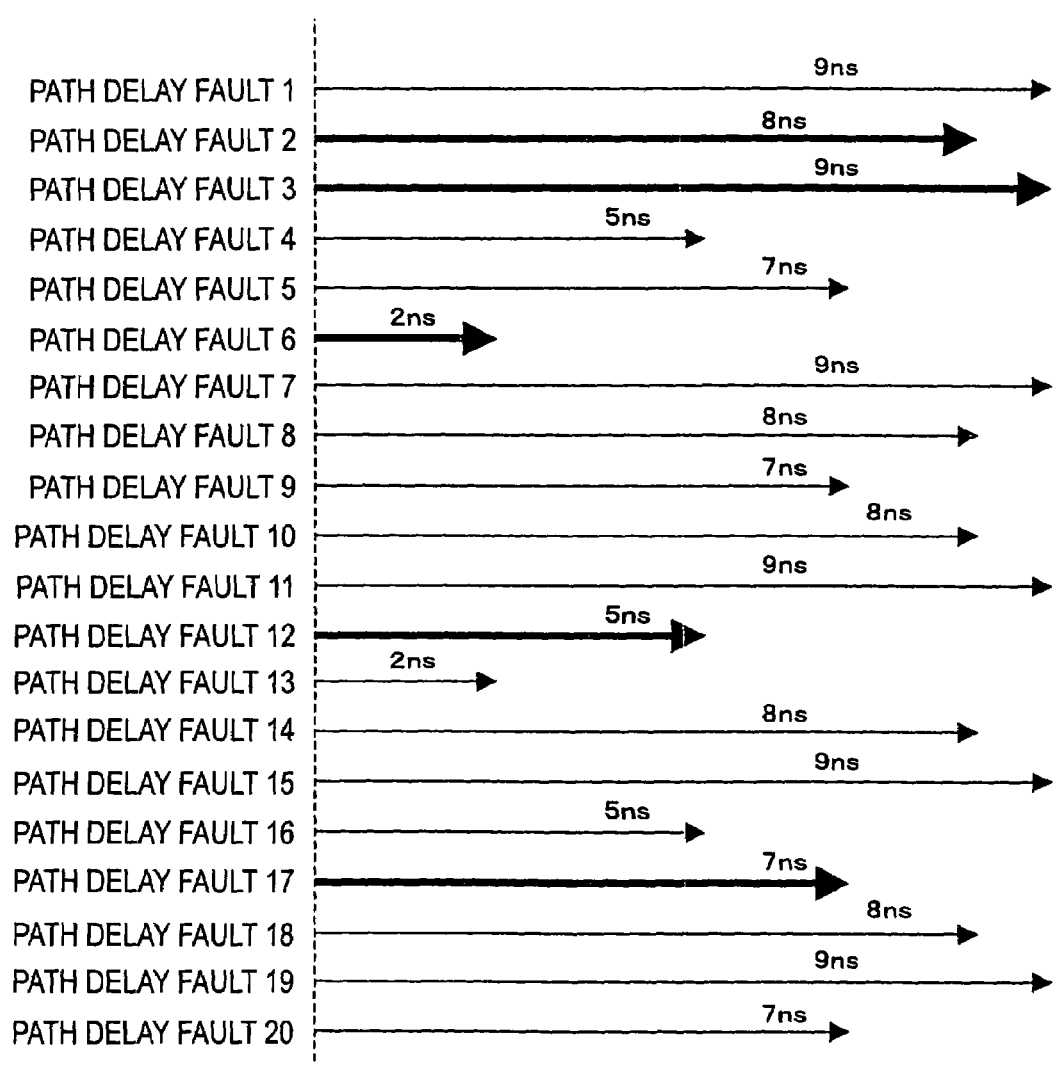
FIG. 10 is a diagram for supplementing the embodiment of the present invention.
Figure 11:
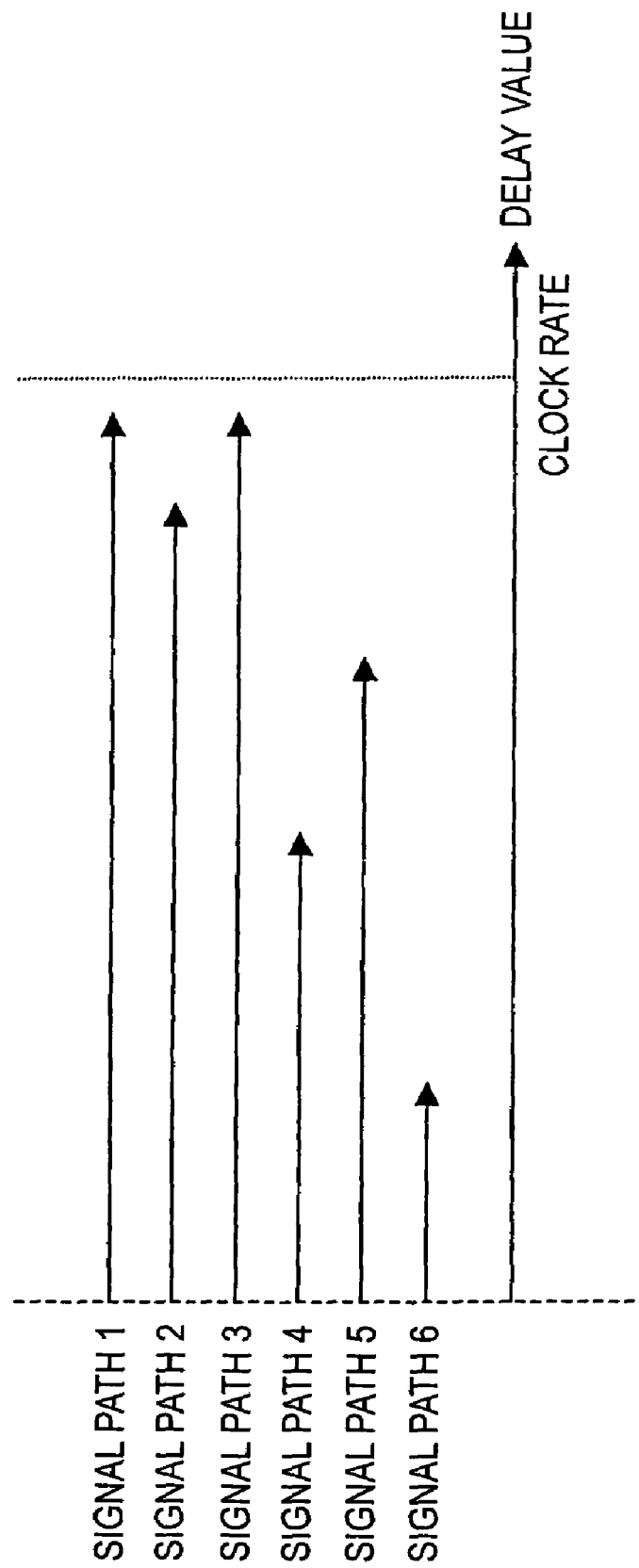
FIG. 11 is a diagram for explaining a problem of a related art.

FIG. 10 is a diagram for explaining an operation of the method for evaluating a delay fault test quality according to the present invention. Path delay faults 1 to 20 indicate the path delay faults defined in logic circuit data 1. An arrow mark in the right side of each path delay fault shows the magnitude of the delay value on the signal path in its design on which each path delay fault is defined. A value above each arrow mark indicates a specific delay value.

Now, the third embodiment of the present invention will be described below by referring to FIGS. 1, 3, and 7 to 10.

Firstly, a fault defining operation 5 is performed for the provided logic circuit data 1 by using delay fault defining information 2. In the delay fault defining information 2, the list of the 20 path delay faults shown in FIG. 10 is stored. Then, in the fault defining operation 5, the path delay faults provided in the delay fault defining information 2 are firstly defined on the signal paths in the logic circuit in an operation 21. Here, it is assumed that the number of defined path delay faults and the number of untestable faults included therein are four of the path delay faults 2, 10, 15 and 20, respectively. Then, in an operation 22, a simple decision is performed for deciding whether or not a path is untestable for all the defined path delay faults. As a result, it is assumed that there is not any fault that is decided to be untestable. Accordingly, in a next operation 23, since there is not any path delay fault that is decided to be untestable, no operation is performed. Then, in an operation 24, the number of defined faults is summed up to 20. Finally, in the operation 71, the sum total of the delay values on the signal paths in their design is calculated for the 20 defined path delay faults. Here, the value of the sum total is calculated as 141 ns from the delay values of the path delay faults respectively shown in FIG. 10.

Then, in a partial fault selecting operation 6, one node is firstly selected in an operation 31. It is assumed that 3000 nodes exist in the provided logic circuit data 1. Then, in an operation 32, the path delay fault having the largest delay value on the signal path is selected among the defined path delay faults that pass the selected node. If there is no defined path delay fault that passes the selected node, the node is taken as a node in which a process is finished to advance to an operation 33. Now, it is assumed that twenty nodes are included on the selected path delay fault. Subsequently, in the operation 33, it is decided whether or not nodes that are not processed are present. Since 2980 nodes are not processed, the procedure advances again to the operation 31 to select one node that is not processed and advance to the operation 32. Now, it is assumed that there is no defined path delay fault that passes the selected node. At this time, the selected node is taken as a processed node to advance to the operation 33. Subsequently, in the operation 33, it is decided whether or not there are nodes that are not processed. Since 2979 nodes are not processed, the procedure advances again to the operation 31. Then, the operations from the operation 31 to the operation 33 are likewise repeated. In the decision 33, when there is not any unprocessed node, the path delay faults that have been yet selected in the operation 32 are finally summed to form a fault list in an operation 34. Now, it is assumed that the fault list composed of five path delay faults including the path delay faults 2, 3, 6, 12 and 17 (the path delay faults shown by thick lines in FIG. 10) is formed.

Then, in the testbale/untestablen deciding operation 7, the path delay fault 2 in the fault list formed in the operation 34 is firstly selected in an operation 41. Then, in an operation 42, an test sequence for the selected fault is generated. It is assumed that the fault is decided to be untestable. Subsequently, in an operation 43, whether or not there are unprocessed faults is decided. Here, since four faults still remain, the procedure advances again to the operation 41 to newly select the path delay fault 3. Then, in the operation 42, an test sequence for the selected fault is generated to decide the fault to be testable. Subsequently, in the operation 43, whether or not there are unprocessed faults is decided. Since three faults still remain, the procedure advances again to the operation 41. The operations from the operation 41 to the operation 43 are similarly repeated. When there is not any unprocessed fault in the operation 43, the procedure advances to an operation 44 to sum up the number of faults decided to be untestable in the operation 42. Now, it is assumed that the number of faults decided to be untestable in the operation 42 is only one, that is, the path delay fault 2. Finally, in the operation 81, the sum total of the delay values of the path delay faults decided to be testable is calculated. Since the fault currently decided to be untestable is only the path delay fault 2, the delay value 8 ns is calculated as the sum total.

Then, in the fault coverage calculating operation 8, a fault simulation is firstly performed by using the provided test sequence 3 in the operation 51. At this time, the faults, which are objects for the fault simulation, are all the faults summed in the operation 24. It is assumed that the number of faults detected in this operation is 7 including the path delay faults 3, 7, 9, 11, 14, 17 and 19. Then, in the operation 91, the sum total of the delay values of the detected path delay faults is calculated. With reference to FIG. 10, the value of the sum total is calculated as 58 ns. Then, in an operation 52, it is assumed that the sum total of the delay values of the detected faults calculated in the operation 91 is taken as a quantity of detected faults, the number of the defined faults summed in the operation 24 is taken as all the number of defined faults, the sum total of the delay values of the defined faults summed in the operation 71 is taken as all the quantity of the defined faults, the number of faults in the fault list formed in the operation 34 is taken as the number of partial selected faults and the sum total of the delay values of the testable faults that is summed in the operation 81 is taken as a quantity of partial untestable faults. Thus, the estimated quantity of untestable faults in all the defined faults is calculated in accordance with a Formula described below.

The estimated quantity of untestable faults=the quantity of partial untestable faults×all the number of defined faults/the number of partial selected faults (Formula 4)

Then, the fault coverage is calculated in accordance with a following Formula by using the calculated estimated quantity of untestable fault.

The fault coverage=the quantity of detected faults/ (all the quantity of defined faults−the estimated quantity of untestable faults)×100% (Formula 5)

Since the quantity of the partial untestable faults, all the number of the defined faults, all the quantity of defined faults, the number of the partial selected faults and the quantity of the detected faults are presently respectively 8 ns, 20, 141 ns, 5, and 58 ns, the estimated quantity of the untestable faults is calculated to be 32 ns in accordance with the (Formula 4). Then, the fault coverage is calculated to be 53.2% in accordance with the (Formula 5).

On the other hand, it is assumed that the sum total of the delay values of actual untestable faults (the path delay faults 3, 10, 15 and 20) is taken as a quantity of untestable faults, the value thereof is 32 ns. Thus, when an actual fault coverage is calculated in accordance with a following Formula, the actual fault coverage is 53. 2%.

The fault coverage=the quantity of detected faults/ (all the quantity of defined faults−the quantity of untestable faults)×100% (Formula 6)

As compared therewith, in the fault coverage in accordance with the (Formula 2) which has been hitherto used in place of the Formula 1, since the number of untestable faults is not absolutely taken into account, a very low value as small as 37.7% is obtained. As a result, the test quality by the provided test sequence is undesirably erroneously estimated.

As described above, in the method for evaluating a delay fault test quality according to the present invention, the number of the faults estimated to be untestbale is taken into consideration, the value of the fault coverage near to the actual fault coverage can be calculated.

Since the number of faults selected in the operation 6 is (5) relative to the number of faults (20) defined in the operation 5, the rate of the former to the latter is 0.25. At this time, when an error of the fault coverage calculated in the operation 8 is statistically obtained as, for instance, 0.2%, a value of (53.2%−0.2%)=53.0% is used as the fault coverage. The excessive estimation of the fault coverage considering a sampling error can be more effectively prevented. As a simpler method, the value of a prescribed error (for instance. 1%) is employed irrespectively of the rate of the number of the faults selected in the operation 6 relative to the number of the defined faults in the operation 5, so that the quantity of calculation can be suppressed.

As a method for performing the partial fault selecting operation 6, a prescribed number of faults may be selected at random from the faults defined in the operation 24 in place of the method shown in FIG. 3 used for explaining the present embodiment to apparently obtain the same effect.

Further, according to this embodiment, in the operations 71, 81 and 91, the delay values on the signal paths in their design on which the path delay faults are defined are used and explained. However, the number of steps of gates on the signal paths or a physical length of the signal path in its design may be used in place of the delay values on the signal paths in their design to obtain the same effect. As the physical length of the signal path, the sum total of wiring length on the signal path that can be calculated from layout data may be used.

Further, according to this embodiment, in the operation 32, the path delay fault having the maximum delay value that passes the node is selected. However, the maximum number of steps of gates or the maximum physical length of the signal path may be used in place of the maximum delay value to obtain the same effect. As the physical length of the signal path, the sum total of wiring length on the signal path that can be calculated from layout data may be used.

As described above, in the method for evaluating a delay fault test quality according to the present invention, a result obtained by analyzing untestable faults is used for a part of faults to estimate the number of untestable faults in all the defined faults. Thus, a highly accurate fault coverage can be calculated by a practical quantity of calculation.

The delay values on the signal paths in their design on which the delay faults are respectively defined are taken into account, so that the importance of the individual delay faults can give effects on the evaluation of the quality of the delay fault test sequence. Thus, the accuracy of evaluating the quality of the delay fault test sequence can be improved. Furthermore, when the delay fault has a higher possibility to actually generate a fault, the delay fault can provide the higher degree of influence on the fault coverage. That is, when such a fault is detected, the fault coverage can be more improved. Conversely, when such a fault is not detected, the fault coverage is more lowered.

What is claimed is:

1. A method for evaluating a delay fault test quality comprising;
    a delay fault definition unit, defining delay faults for a semiconductor integrated circuit;
    a delay fault selecting unit, selecting a part of the delay faults defined by the delay fault defining unit;
    a first testable/untestable deciding unit, deciding whether or not a test can be performed for each delay fault selected by the delay fault selecting unit; and
    a delay fault coverage calculating unit, calculating a delay fault coverage by using the number of the delay faults decided to be untestable by the testable/untestable deciding unit.

2. The method for evaluating a delay fault test quality according to claim 1, wherein the delay fault defining unit defines path delay faults for all signal paths in the semiconductor integrated circuit.

3. The method for evaluating a delay fault test quality according to claim 1, wherein the delay fault defining unit defines the delay faults for all nodes in the semiconductor integrated circuit.

4. The method for evaluating a delay fault test quality according to claim 1, further comprising a second testable/untestable deciding unit for previously deciding whether or not the delay faults to be processed in the semiconductor integrated circuit can be tested.

5. The method for evaluating a delay fault test quality according to claim 4, wherein the delay fault defining unit further includes a second testable/untestable for previously deciding whether or not the delay faults in the semiconductor integrated circuit can be tested and only the delay faults decided to be testabe by the second testable/untestable deciding unit are defined in the semiconductor integrated circuit.

6. The method for evaluating a delay fault test quality according to claim 1, wherein the delay fault defining unit defines a prescribed number of delay faults smaller than the total number of delay faults for the semiconductor integrated circuit.

7. The method for evaluating a delay fault test quality according to claim 1, wherein the delay fault selecting unit selects a prescribed number or a prescribed rate of delay faults of the delay faults defined by the delay fault defining unit at random.

8. The method for evaluating a delay fault test quality according to claim 2, wherein the delay fault selecting unit selects the signal path having a maximum delay value that passes the node for each node among the path delay faults defined by the delay fault defining unit.

9. The method for evaluating a delay fault test quality according to claim 2, wherein the delay fault selecting unit selects the signal path having a maximum number of steps of gates that passes the node for each node among the path delay faults defined by the delay fault defining unit.

10. The method for evaluating a delay fault test quality according to claim 2, wherein the delay fault selecting unit selects the longest signal path that passes the node for each node among the path delay faults defined by the delay fault defining unit.

11. The method for evaluating a delay fault test quality according to claim 1, wherein the first testable/untestable deciding unit generates an test sequence for the delay fault selected by the delay fault selecting unit and decides the delay fault in which the test sequence cannot be generated to be untestable.

12. The method for evaluating a delay fault test quality according to claim 1, wherein the delay fault coverage calculating unit further includes a delay fault simulation unit for performing a delay fault simulation by using the provided test sequence for the delay faults defined by the delay fault defining unit; and a fault coverage calculating unit for calculating a fault coverage by using the number of delay faults defined by the delay fault defining unit, the number of delay faults which are decided to be untestable by the first testable/untestable deciding unit and the number of delay faults detected by the delay fault simulation.

13. The method for evaluating a delay fault test quality according to claim 12, wherein the fault coverage calculating unit takes a value obtained by integrating a ratio of the number of delay faults selected by the delay fault selecting unit to the number of delay faults defined by the delay fault defining unit relative to the number of delay faults decided to be untestable by the first testable/untestable unit as a total number of untestable delay faults, takes a numerator of the delay fault coverage as the number of delay faults detected by the delay fault simulation unit and calculates a denominator of the delay fault coverage by subtracting the total number of untestable delay faults from the number of delay faults selected by the delay fault selecting unit.

14. The method for evaluating a delay fault detection quality according to claim 2, wherein the delay fault defining unit further includes a first total value calculating unit for calculating the total value of a quantity of delay of the signal paths in design on which the path delay faults are defined, the first testable/untestable deciding unit further includes a second total value calculating unit for calculating the total value of a quantity of delay of the signal paths in design on which the path delay faults are decided to be untestable, and the delay fault coverage calculating unit further includes a third total value calculating unit for calculating the total value of a quantity of delay of the signal paths in design on which the path delay faults are detected and a fault coverage calculating unit for calculating a fault coverage by using the total value of the quantity of delay of the signal paths in design on which the defined path delay faults are calculated by the first total value calculating unit, the total value of the quantity of delay of the signal paths in design on which the untestable path delay faults are calculated by the second total value calculating unit and the total value of the quantity of delay of the signal paths in design on which the detected path delay faults are calculated by the third total value calculating unit.

15. The method for evaluating a delay fault test quality according to claim 14, wherein the fault coverage calculating unit takes a value obtained by integrating a ratio of the number of delay faults selected by the delay fault selecting unit to the number of delay faults defined by the delay fault defining unit relative to the total value of the quantity of delay of the signal paths in design on which the untestable path delay faults are calculated by the second total value calculating unit as a total quantity of untestable delay faults, takes a numerator of the delay fault coverage as the total value of the quantity of delay of the signal paths in design on which the detected path delay faults are calculated by the third total value calculating unit and calculates a denominator of the delay fault coverage by subtracting the total quantity of untestable faults from the total value of the quantity of delay of the signal paths in design on which the defined path delay faults are calculated by the first total value calculating unit.

16. The method for evaluating a delay fault test quality according to claim 14 or 15, wherein as the quantity of delay of the signal path in design, a delay value of the signal path in design is used.

17. The method for evaluating a delay fault test quality according to claim 14 or 15, wherein as the quantity of delay of the signal path in design, the number of the steps of the gates on the signal path is used.

18. The method for evaluating a delay fault test quality according to claim 14 or 16, wherein as the quantity of delay of the signal path in design, the physical length of the signal path is used.

19. The method for evaluating a delay fault test quality according to claim 1, wherein a value obtained by subtracting a prescribed error a from the delay fault coverage is taken as the delay fault coverage.

20. The method for evaluating a delay fault test quality according to claim 1, wherein assuming that the rate of the number of delay faults selected by the delay fault selecting unit to the number of delay faults defined by the delay fault defining unit is $\beta$ and the error of the delay fault coverage is $\Gamma$, a value obtained by subtracting the error $\Gamma$ from the delay fault coverage is taken as the delay fault coverage.

* * * * *